United States Patent [19]

Pagliaro et al.

[11] 4,022,619

[45] May 10, 1977

[54] COMPOSITE DEVELOPER-ETCH COMPOSITION FOR CHROMIUM-PLATED LITHOGRAPHIC PRINTING PLATES

[75] Inventors: Vincent A. Pagliaro; Richard G. Walters, both of Racine, Wis.

[73] Assignee: Printing Developments, Inc., New York, N.Y.

[22] Filed: Apr. 14, 1975

[21] Appl. No.: 567,521

[52] U.S. Cl. .................................. 96/33; 96/36; 96/36.3; 96/48 R; 156/659; 156/654; 252/79.1
[51] Int. Cl.[2] ...................... G03F 7/02; G03C 5/00
[58] Field of Search ............. 96/33, 48 R, 36.3, 36; 101/454, 459, 463; 252/79.1; 156/7, 8

[56] References Cited

UNITED STATES PATENTS

| | | | |
|---|---|---|---|
| 2,599,914 | 6/1952 | Hartsuch et al. | 75/111 |
| 3,625,687 | 12/1971 | Dunkle | 96/33 |
| 3,747,525 | 7/1973 | Maffet et al. | 96/33 |
| 3,865,595 | 2/1975 | Watkinson | 96/33 |

*Primary Examiner*—Edward C. Kimlin
*Attorney, Agent, or Firm*—Brumbaugh, Graves, Donohue & Raymond

[57] ABSTRACT

A composite developer-etch composition for chromium-plated lithographic printing plates comprises an aqueous solution of aluminum chloride, a water-soluble chloride other than aluminum chloride, phosphoric acid, and an acid-stable water-soluble reducing agent; the composition having a particular specific gravity range.

6 Claims, No Drawings

COMPOSITE DEVELOPER-ETCH COMPOSITION FOR CHROMIUM-PLATED LITHOGRAPHIC PRINTING PLATES

The present invention relates to a composite deveoper-etch composition for chromium-plated lithographic printing plates and to a single step process for using the same.

Chromium-plate lithographic printing plates are bimetallic or trimetallic plates. The bimetallic plates have a layer of chromium plated upon a base metallic layer of copper, brass, etc., while the trimetallic plates have a layer of chromium plated upon a layer of copper with the copper layer in turn being plated upon a base metallic layer, such as aluminum, steel, zinc or stainless steel. The chromium layer has superimposed thereon a photosensitive resist coating comprising a photosensitive material and a binder, for example, a dichromate plus gum arabic.

In use, the lithographic printing plate is exposed through a positive transparency to a light source so as to form image areas in those areas of the photosensitive resist coating which are not exposed to the light source and to form nonimage areas in those areas which are exposed to the light source. The light exposed lithographic plate is thereafter conventionally treated in a first step by hand or by machine splashing with a developer, such as an aqueous solution containing calcium chloride and lactic acid. The developer dissolves the light exposed in the image areas while leaving an etch resistant hardened film or stencil in the nonimage areas of the resist coating.

The chromium layer which has been laid bare in the image areas by the developer is thereafter treated in a second step with a chromium etch which generally contains hydrochloric acid so as to remove the chromium in the image areas and thereby lay bare the copper layer underneath. The hardened stencil is then removed from the nonimage areas so as to lay bare the chromium thereunder.

The product thus formed in a lithographic printing plate since the copper image areas are ink-receptive while the chromium nonimage areas are water-receptive.

The above-described two-step process for first developing and then etching a chromium-plated lithographic printing plate having a light exposed photosensitive resist gum coating thereon has the disadvantages of requiring separate developing and etching steps and requiring the use of a chromium etch containing hydrochloric acid which liberates noxious acid vapors during etching.

It has been proposed heretofore (expired U.S. Pat. No. 2,599,914) to use a hydrochloric acid-free solution for etching chromium which could also act as a developer so that noxious acid vapors are eliminated. The heretofore proposed dual developer-etch composition for chromium plated lithographic printing plates is prepared from a 32° Baume aluminum chloride solution which has its Baume brought up to 41° Baume with zinc chloride and has a phosphoric acid content of about 1–4 fluid ounces per gallon of the aluminum chloride-zinc chloride solution. Therefore, this composition comprises an aqueous solution of 23.7% by weight of aluminum chloride, 15.2% by weight of zinc chloride, about 1% by weight of phosphoric acid and the balance water. It has a specific gravity at 70° F. of about 1.394. This heretofore proposed composition has the disadvantages of (1) being extremely slow to etch, (2) attacking the gum stencil during etch thereby degrading the reproduction quality and (3) having a development speed which is very sensitive to variations in the concentration of the phosphoric acid.

Accordingly, it is the object of the present invention to provide a composite developer-etch composition for chromium-plated lithographic printing plates which enable such plates to be developed and etched in a single step process without suffering from the above-mentioned disadvantages.

In accordance with the present invention, there is provided a composite developer-etch composition for chromium-plated lighographic printing plates which comprises an aqueous solution of from about 16% to about 22% by weight of aluminum chloride, from about 20% to about 26% by weight of a water-soluble chloride other than aluminum chloride, from about 2.2% to about 4.0% by weight of 85% strength phosphoric acid, from about 0.6% to about 1.4% by weight of an acid-stable water-soluble reducing agent and the balance water. These compositions have a specific gravity at 70° F. from about 1.4 to about 1.5.

The water-soluble chloride other than aluminum chloride is preferably a chloride of a metal of Group I or Group II of the Mendeleeff Periodic Table, such as the chlorides of lithium, sodium, potassium, copper, cesium, magnesium, calcium, zinc, strontium, cadmium and barium. Further, such water-soluble chlorides include the chlorides of tin, vanadium, chromium, manganese, iron, cobalt, nickel, etc.

The acid-stable water-soluble reducing agent preferably is an alkali metal (e.g., lithium, sodium, potassium) or an alkali earth metal (e.g., calcium, strontium, barium) hypophosphite, thiosulfate, or iodide, although other such agents may be used.

The phosphoric acid of 85% strength can be replaced by a phosphoric acid of less or greater strength, provided a corresponding adjustment is made in the water content of the aqueous solution. Aluminum chloride in the form of the hexahydrate can be used in lieu of anhydrous aluminum chloride, provided an adjustement is made in the water content of the aqueous solution.

The compositions of the invention are prepared by adding the solid components to the liquid components with agitation so as to form the aqueous solution. If desired, the aluminum chloride and/or the other water-soluble chloride can first be dissolved in portion of the total water content so as to form aluminum chloride and/or other water-soluble chloride solutions of the requisite Baume strength and the remaining components then added thereto with agitation.

The single step process of the invention for both developing and etching a chromium-plated lithographic printing plate having a light exposed photosensitive resist gum coating thereon comprises treating said plate with a composition of the invention, for example, by hand or by machine splashing.

Typical representative and preferred compositions of the invention are as follows:

TABLE I

| Components/Example No. | | % by Weight | | | |
|---|---|---|---|---|---|
| | | 1 | 2 | 3 | 4 |
| Aluminum chloride (anhydrous basis)* | | 18.63 | 18.93 | 19.60 | 20.66 |
| Zinc chloride (anhydrous basis) | | 24.12 | 23.86 | 25.38 | 21.55 |
| Phosphoric acid (85%) | | 2.85 | 2.43 | 3.00 | 3.97 |
| Sodium hypophosphite (technical) | | 0.69 | 0.68 | 0.74 | .70 |
| Water | | 53.71 | 54.10 | 51.28 | 53.12 |
| | TOTAL | 100 | 100 | 100 | 100 |
| Specific Gravity at 70° F. | | 1.45 | 1.45 | 1.49 | 1.46 |

*Based on 32° Baume solution containing 28% AlCl$_3$

The composition and process of the invention in comparison with the above prior art are characterized by (1) a slight decrease in development time, (2) an extremely large reduction in etch time and (3) a significantly better reproduction fidelity due to (a) no attack of the stencil during etch and (b) the ability to etch extremely small holes and small dots simultaneously without affecting each other.

It will be appreciated that various modifications and changes may be made in the subject matter of the invention in addition to those noted above by those skilled in the graphic arts without departing from the essence of the invention and that accordingly the invention is to be limited only by the scope of the appended claims.

What is claimed is:

1. A composite developer-etch composition for chromium-plated lithographic printing plates which comprises an aqueous solution of from about 16% to about 22% by weight of aluminum chloride, from about 20% to about 26% by weight of a water-soluble chloride other than aluminum chloride, from about 2.2% to about 4.0% by weight of 85% strength phosphoric acid, from about 0.6% to about 1.4% by weight of acid-stable water-soluble alkali metal or alkali earth metal hypophosphite reducing agent and the balance water; said composition having a specific gravity at 70° F. of from about 1.4 to about 1.5

2. The composition defined by claim 1 which comprises an aqueous solution of from about 16% to about 22% by weight of aluminum chloride; from about 20% to about 26% by weight of a water-soluble chloride of a metal of Group I or Group II of the Mendeleeff Periodic Table; from about 2.2% to about 4.0% by weight of 85% strength phosphoric acid; from about 0.6% to about 1.4% by weight of an acid-stable water-soluble alkali metal or alkali earth metal hypophosphite reducing agent; and the balance water; said compositon having a specific gravity at 70° F. of from about 1.4 to about 1.5.

3. The composition defined by claim 2 which comprises an aqueous solution of from about 16% to about 22% by weight of aluminum chloride, from about 20% to about 26% by weight of zinc chloride, from about 2.2% to about 4.0% by weight of 85% strength phosphoric acid, from about 0.6% to about 1.4% by weight of sodium hypophosphite and the balance water; said composition having a specific gravity at 70° F. of from about 1.4 about 1.5

4. The composition defined by claim 3 which comprises an aqueous solution of about 18% by weight of aluminum chloride, about 24% by weight of zinc chloride, about 3% by weight of 85% strength phosphoric acid, about 0.7% by weight of sodium hypophosphite and the balance water; said composition having a specific gravity at 70° F. of about 1.4

5. The composition defined by claim 3 which comprises an aqueous solution of about 19% by weight of aluminum chloride, about 25% by weight of zinc chloride, about 3% by weight of 85% strength phosphoric acid, about 0.7% by weight of sodium hypophosphite and the balance water; said composition having a specific gravity at 70° F. of about 1.4

6. The composition defined by claim 3 which comprises an aqueous solution of about 20% by weight of aluminum chloride, about 22% by weight of zinc chloride, about 4% by weight of 85% strength phosphoric acid, about 0.7% by weight of sodium hypophosphite and the balance water; said composition having a specific gravity at 70° F. of about 1.5.

* * * * *

UNITED STATES PATENT AND TRADEMARK OFFICE
CERTIFICATE OF CORRECTION

PATENT NO. : 4,022,619

DATED : May 10, 1977

INVENTOR(S) : Vincent A. Pagliaro et al

It is certified that error appears in the above-identified patent and that said Letters Patent are hereby corrected as shown below:

Col. 1, line 9, "Chromium-plate" should be -- Chromium-plated --; line 31, after "exposed" insert -- coating --. Col. 2, line 18, "lighographic" should be -- lithographic --; line 55, before "portion" insert -- a --. Col. 3, line 35, before "acid-stable" insert -- an --. Col. 4, line 25, after "1.4" insert -- to --.

Signed and Sealed this

Sixth Day of September 1977

[SEAL]

Attest:

RUTH C. MASON
Attesting Officer

LUTRELLE F. PARKER
Acting Commissioner of Patents and Trademarks